United States Patent [19]
Sander et al.

[11] Patent Number: 6,054,738
[45] Date of Patent: Apr. 25, 2000

[54] INTEGRATED CIRCUIT CONFIGURATION FOR DRIVING A POWER MOSFET WITH A LOAD ON THE SOURCE SIDE

[75] Inventors: Rainald Sander; Chihao Xu, both of Müchen, Germany

[73] Assignee: Siemens Aktiengesellschaft, Munich, Germany

[21] Appl. No.: 09/136,206

[22] Filed: Aug. 19, 1998

Related U.S. Application Data

[63] Continuation of application No. PCT/DE97/00305, Feb. 19, 1997.

[30] Foreign Application Priority Data

Feb. 19, 1996 [DE] Germany ............... 196 06 100

[51] Int. Cl.[7] .............. H01L 29/76; H01L 29/74
[52] U.S. Cl. ............... 257/341; 257/133; 257/342; 257/401
[58] Field of Search ............... 438/268–274; 257/341, 342, 343, 401, 133–145

[56] References Cited

U.S. PATENT DOCUMENTS

| | | | |
|---|---|---|---|
| 4,893,158 | 1/1990 | Mihara et al. | 257/341 |
| 5,629,542 | 5/1997 | Sakamoto et al. | 257/328 |
| 5,880,506 | 3/1999 | Maier et al. | 257/401 |

FOREIGN PATENT DOCUMENTS

| | | |
|---|---|---|
| 0 632 501 A1 | 1/1995 | European Pat. Off. . |
| 44 29 285 C1 | 10/1995 | Germany . |
| 44 23 733 A1 | 1/1996 | Germany . |

OTHER PUBLICATIONS

"Design of a High Side Driver in Multipower–BCD and VI Power Technologies" (Contiero et al.), Electron Devices, 1987, Institute of Electrical and Electronics Engineers, pp. 766–769.

"The Smart Power High–Side Switch: Description of a Specific Technology, Its Basic Devices, and Monitoring Circuitries" (Elmoznine et al.), IEEE Transactions on Electron Devices, vol. 37, No. 4, Apr. 1990, pp. 1154–1161.

"Reverse Bias Over Current Protection for Power Field–Effect Transistors", Technical Disclosure Bulletin, vol. 29, No. 2, Jul. 1986, pp. 567–569.

"Secure Circuits with TOPFET" (Lemme), Electronics, vol. 4, 1993, pp. 24–27.

*Primary Examiner*—Tom Thomas
*Assistant Examiner*—Ori Nadav
*Attorney, Agent, or Firm*—Herbert L. Lerner; Laurence A. Greenberg; Werner H. Stemer

[57] ABSTRACT

Field-effect-controllable power semiconductor components with a source-connected load are made conducting via a control circuit with an integrated charge pump. When a generator connected to the source side is in operation, then the source potential becomes higher than the drain potential. A parasitic diode therefore carries current in the control circuit. That current turns on a parasitic bipolar transistor that limits the gate potential to a value that is no longer sufficient for making the power semiconductor component conducting. This effect is prevented by connecting a further diode in antiseries with the parasitic diode.

4 Claims, 2 Drawing Sheets

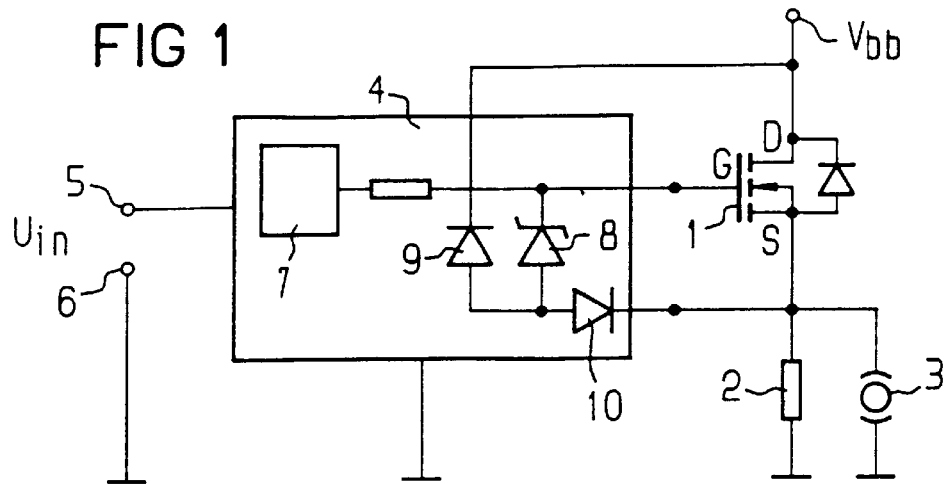
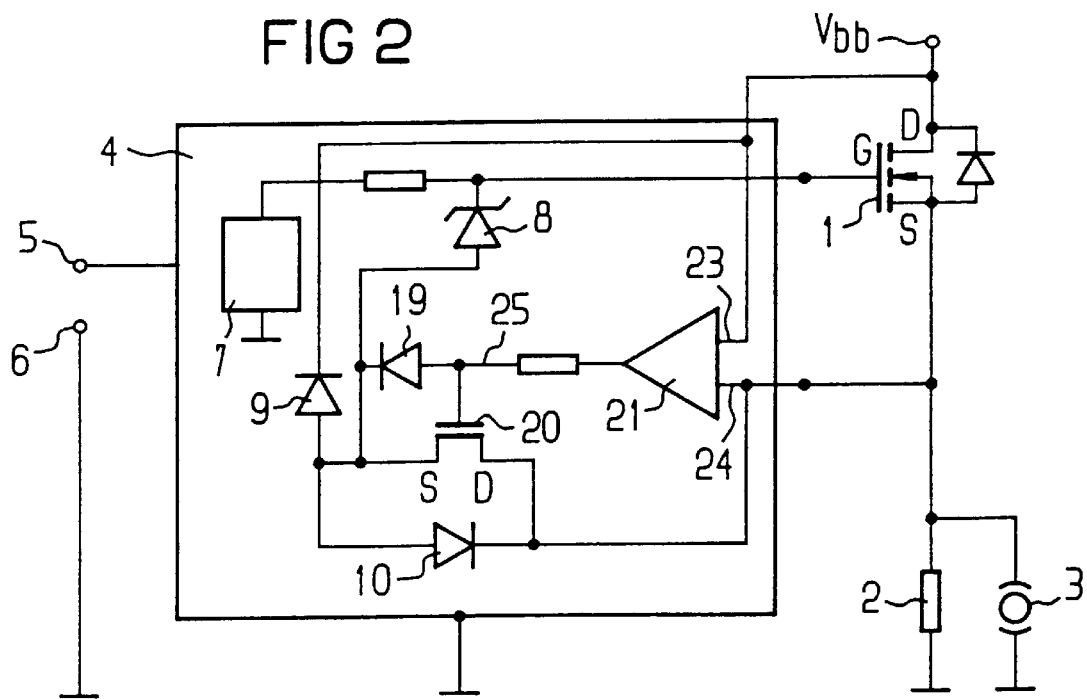

PRIOR ART

INTEGRATED CIRCUIT CONFIGURATION FOR DRIVING A POWER MOSFET WITH A LOAD ON THE SOURCE SIDE

Cross-Reference to Related Application

This is a continuation of copending international application PCT/DE97/00305, filed Feb. 19, 1997, which designated the United States.

BACKGROUND OF THE INVENTION

Field of the Invention

The invention relates to an integrated circuit configuration for driving a field-effect-controllable power semiconductor component with a load on the source side. A control circuit connected between a gate terminal and a source terminal of the power semiconductor component drives the gate with a gate potential that is higher than its drain terminal. The control circuit is integrated in a well of a first conductivity type, the well is embedded in a zone of a semiconductor body of a second conductivity type, and the zone is connected to the drain terminal of the power semiconductor component. A parasitic diode in the control circuit is formed by a p-n junction between the well and the zone. The parasitic diode is disposed between the drain and the source of the power semiconductor component.

Such circuit configurations are a component of so-called "smart FETs". Smart FETs are commercially available and their specifications and layout can be found in the relevant data specifications. The basic layout of such a circuit configuration is shown in FIG. 4, and its basic integration is shown in FIG. 5. The problem the present invention seeks to solve will now explained with reference to these drawing figures.

With reference to FIG. 4, the power semiconductor component is a power MOSFET 1. A load 2 is connected in series with it on the source side, and a generator 3 is connected parallel to the load. The series circuit comprising 1, 2 and 3 is connected to an operating voltage $V_{bb}$ such that the drain terminal D is at the potential $V_{bb}$.

In order for them to be turned on, power MOSFETs with a load on the source side are known to require a gate potential that is higher than the drain potential. This potential is generated for instance by a charge pump 7, which is part of an integrated control circuit 4 used to drive the power MOSFET 1. Since the reference potential for the control circuit is generally ground, the charge pump 7 must generate a voltage that is higher than the voltage $V_{bb}$. The gate-to-source voltage $U_{GS}$ of 1 is generally limited, between the gate terminal G and the source terminal S, by at least one Zener diode 8. The control circuit 4 has a control input with the terminals 5, 6. By applying an input voltage $U_{in}$ to the terminals 5, 6, the charge pump 7 is put into operation, and the power MOSFET 1 is rendered conducting.

When an on-board electrical system in a motor vehicle, for instance, is in operation, then the generator 3 typically generates a current for the load 2 and for charging the battery to the operating voltage $V_{bb}$ The voltage generated by the generator must therefore be higher than V. The battery can be charged, however, only if the power MOSFET 1 remains in the conducting state. Charging with the parasitic diode that is connected antiparallel to the power MOSFET 1 is not desired, because that would lead to major losses because of the high threshold voltage. On the other hand, it is then not assured that the power MOSFET 1 will remain in the on state with the aid of the charge pump 7 of the integrated circuit configuration 4. This is so because the integrated control circuit 4 also has at least one parasitic diode, identified by reference numeral 9. This diode is connected to the source terminal of the power MOSFET 1 via one output of the control circuit, and to the drain terminal of the power MOSFET via a supply voltage terminal of the control circuit.

If in generator operation the source potential becomes greater than the drain potential, then the parasitic diode 9 begins to conduct. It switches on a parasitic bipolar transistor, which is connected between the drain terminal G and the drain terminal D of the power MOSFET 1. Turning on the parasitic bipolar transistor prevents the gate potential from becoming greater than the drain potential. Accordingly, in the generator mode, the power MOSFET 1 cannot be turned on.

FIG. 5 shows the integrated version of the control circuit of FIG. 4. A p-doped well 12 is embedded in a weakly n-doped semiconductor body 11, and a highly n-doped zone 17 is in turn embedded in the well 12. The zone 17 forms the cathode zone of the protective diode 8, while the parasitic diode 9 is formed by the p-doped well 12 and the n-doped zone 11. The zone 17, analogously to the circuit of FIG. 4, is connected via a contact to the output of the charge pump 7 and to the gate terminal of the power MOSFET 1. The power MOSFET 1 is typically integrated into the same semiconductor body, and has a p-doped base zone 14 and source zones 15 embedded in the base zone 14. The zones 14 and 15 are contacted and, via a contact, are connected with the well 12. The well 12 is thus at the source potential. If the generator is not in operation, the drain potential of the MOSFET 1 is thus blocked, as the parasitic bipolar transistor 13 is formed by the zones 17, 12 and 11. In the generator mode, as noted, the source potential is higher than the drain potential, and the parasitic diode 9 is thus conducting and the parasitic bipolar transistor 13 is on. A current thus flows between the zone 17 and the zone 11, or in other words between the charge pump 7 and the terminal $V_{bb}$. The voltage at the gate of the power MOSFET 1 therefore drops, and the power MOSFET can no longer be turned on.

An integrated circuit configuration of this generic type for driving a power MOSFET with a load on the source side is known from the commonly owned German patent DE 44 29 285. There, a power MOSFET with a source terminal and a drain terminal is disclosed which is driven via a control circuit. That circuit configuration also has a parasitic diode in the control circuit.

To avoid the parasitic diode, or in other words to isolate it, a p-n isolation is typically used, of the kind described by Contiero et al. in "Design of a High Side Driver in Multi-power BCD and VIPower Technologies": Electron Devices, Washington, December 1987, IEEE, pp. 766–769. There, for p-n isolation, an antiseries diode is connected between the control electronics and the drain region.

SUMMARY OF THE INVENTION

It is accordingly an object of the invention to provide an improved integrated circuit for driving a power MOSFET with a source-side load, which overcomes the above-mentioned disadvantages of the heretofore-known devices and methods of this general type and which maintains the power MOSFET reliably conducting even if the source potential becomes higher than the drain potential.

With the foregoing and other objects in view there is provided, in accordance with the invention, an integrated circuit configuration for driving a field-effect-controllable power semiconductor component with a source, a gate, a drain, and a load connected to the source, comprising:

a semiconductor body of a first conductivity type;

a zone formed in the semiconductor body, the zone being connected to a drain terminal of a power semiconductor component;

a well of a second conductivity type embedded in the zone;

a control circuit connected between a gate terminal and a source terminal of the power semiconductor component and integrated in the well;

the control circuit driving the gate terminal of the power semiconductor component with a gate potential higher than a drain potential thereof;

a parasitic diode in the control circuit formed by a p-n junction between the well and the zone and disposed between the drain terminal and the source terminal of the power semiconductor component;

a further diode connected in antiseries with the parasitic diode, the further diode including an additional zone of the first conductivity type embedded in the well and connected to the source terminal of the power semiconductor component; and a controllable switch having a load path connected in parallel with the further diode, the controllable switch conducting if the drain potential of the power semiconductor component is higher than a source potential thereof, and blocking if the source potential of the power semiconductor component is higher than the drain potential thereof.

In accordance with an added feature of the invention, there is provided a comparator having a first input connected to the drain terminal of the power semiconductor component, a second input connected to the source terminal of the power semiconductor component, and an output. Furthermore, the controllable switch is a MOSFET having a gate terminal connected to the output of the comparator.

In accordance with an additional feature of the invention, the MOSFET is a depletion FET having a drain zone formed by a cathode zone of the further diode, and a source zone electrically connected to the well.

In accordance with a concomitant feature of the invention, there is provided a protective diode integrated in the well and connected between the gate terminal and the source terminal of the power semiconductor component.

Other features which are considered as characteristic for the invention are set forth in the appended claims.

Although the invention is illustrated and described herein as embodied in an integrated circuit configuration for driving a power MOSFET with a source-side load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic view illustrating the principle of the invention;

FIG. 2 is a circuit diagram of a configuration according to the invention;

DESCRIPTION OF THE PREFERRED EMBODIMENTS

Figure 4:
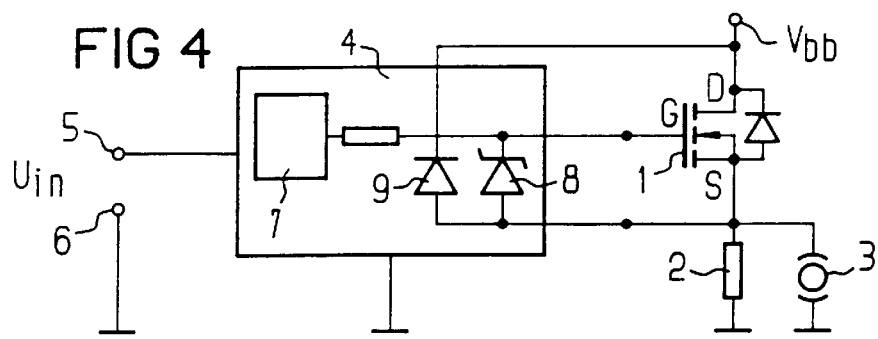
FIGS. 4 is a circuit diagram of a prior art circuit.
Figure 5:
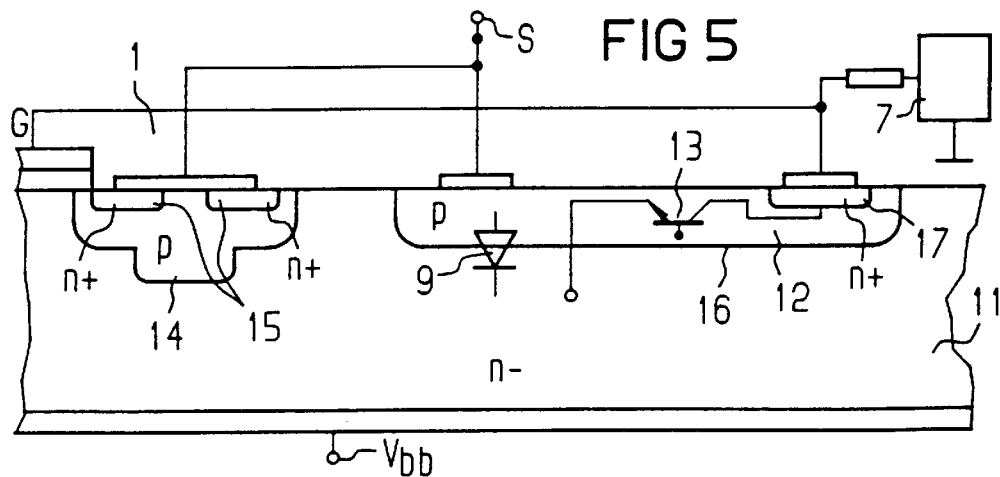
FIG. 5 is a partial, diagrammatic side view of an integrated prior art circuit.

The circuit configuration of FIG. 1 differs from the prior art of FIG. 4 in that a further diode 10 is connected in antiseries with the parasitic diode 9. The diode 10 can be connected to the diode 9 in such a way that either their anode zones or their cathode zones are connected to one another. it can be integrated with the control circuit or it may be implemented discretely. If the source potential of the MOSFET 1 becomes greater than the drain potential, then no current can flow through the diode 9. Thus the parasitic bipolar transistor 13 (cf. FIG. 5) cannot be turned on, either. In that case, the power MOSFET 1 remains on, even if the voltage in its drain-source path is reversed. The generator 3 can thus charge the battery via the MOSFET 1 with low impedance, so that only slight losses ensue.

Figure 3:
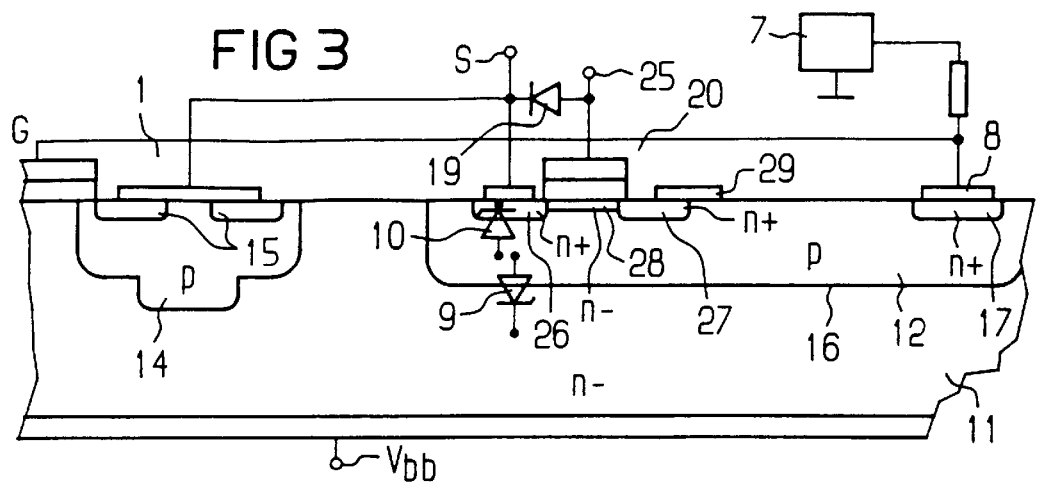
FIG. 3 is a partial, diagrammatic side view of an integrated implementation of a portion of the circuit of FIG. 2.

With reference to FIG. 3, the further diode 10 may be embodied by a highly n-doped zone 26 integrated with the well 12. The zone 26 forms the cathode zone of the diode 10 and the well 12 forms its anode zone.

If the further diode 10 is integrated with the control circuit, then under certain conditions it can also turn on parasitic bipolar structures. The circuit configuration of FIG. 1 can therefore be refined as shown in FIG. 2. The control circuit 4 includes a depletion FET 20, with which the diode 10 is connected in parallel. The gate terminal of 20 is connected to the output of a comparator 21 via a terminal 25 and a resistor. The comparator 21 has a first input 23, which is connected to the drain of the power MOSFET 1, and a second input 24, which is connected to the source of the power MOSFET 1. The depletion MOSFET 20 is made conducting by the comparator 21 whenever the voltage at the input 23 is greater than the voltage at the input 24 of the comparator 21, or in other words whenever the drain potential is higher than the source potential of the power MOSFET 1. If the source potential becomes higher than the drain potential, then a voltage that blocks the MOSFET 20 appears at the output of the comparator 21. Thus no current can flow through the parasitic diode 9, and the power MOSFET 1 remains securely turned on via the charge pump 7. To adjust the operating point of the depletion FET 20, its gate terminal is connected to the source terminal via a diode 19.

In the integrated circuit configuration of FIG. 3, the depletion FET 20 is a lateral FET, whose drain zone is the zone 26. A highly n-doped source zone 27 is disposed at a distance from it. The drain zone and the source zone are connected to one another by a weakly n-doped channel zone 28. The source zone 27 is connected to the p-doped well 12 via an ohmic contact. The gate terminal of the MOSFET 20 is connected to the output of the comparator 21 (FIG. 2) via a terminal 25. Otherwise, the integrated structure of FIG. 3 is equivalent to that of FIG. 5.

We claim:

1. An integrated circuit configuration for driving a field-effect-controllable power semiconductor component with a source, a gate, a drain, and a load connected to the source, comprising:

a semiconductor body of a first conductivity type;

a zone formed in said semiconductor body, said zone being connected to a drain terminal of a power semiconductor component;

a well of a second conductivity type embedded in said zone;

a control circuit connected between a gate terminal and a source terminal of the power semiconductor component and integrated in said well;

said control circuit driving the gate terminal of the power semiconductor component with a gate potential higher than a drain potential thereof;

a parasitic diode in said control circuit formed by a p-n junction between said well and said zone and disposed between the drain terminal and the source terminal of the power semiconductor component;

a further diode connected in antiseries with said parasitic diode, said further diode including an additional zone of the first conductivity type embedded in said well and connected to the source terminal of the power semiconductor component; and a controllable switch having a load path connected in parallel with said further diode, said controllable switch conducting if the drain potential of the power semiconductor component is higher than a source potential thereof, and blocking if the source potential of the power semiconductor component is higher than the drain potential thereof.

2. The integrated circuit configuration according to claim 1, which further comprises a comparator having a first input connected to the drain terminal of the power semiconductor component, a second input connected to the source terminal of the power semiconductor component, and an output, and wherein said controllable switch is a MOSFET having a gate terminal connected to said output of said comparator.

3. The integrated circuit configuration according to claim 2, wherein said MOSFET is a depletion FET having a drain zone formed by a cathode zone of said further diode, and a source zone electrically connected to said well.

4. The integrated circuit configuration according to claim 1, which further comprises a protective diode integrated in said well and connected between the gate terminal and the source terminal of the power semiconductor component.

* * * * *